United States Patent
Lee et al.

(10) Patent No.: US 7,544,534 B2
(45) Date of Patent: Jun. 9, 2009

(54) ORGANIC LIGHT-EMITTING DIODE (OLED) AND METHOD OF FABRICATION THEREOF

(75) Inventors: Hun-Jung Lee, Suwon-si (KR); Sang-Il Park, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 278 days.

(21) Appl. No.: 11/051,326

(22) Filed: Feb. 7, 2005

(65) Prior Publication Data

US 2005/0173709 A1 Aug. 11, 2005

(30) Foreign Application Priority Data

Feb. 9, 2004 (KR) ............. 10-2004-0008494

(51) Int. Cl.
*H01L 21/00* (2006.01)
(52) U.S. Cl. .............. 438/82; 438/99; 257/40
(58) Field of Classification Search ......... 257/40, 257/642–643, 759, E51.001–E51.052, E25.008, 257/E25.009; 438/29, 69, 82, 99, 301.33, 438/690; 252/301.33; 428/690
See application file for complete search history.

(56) References Cited

U.S. PATENT DOCUMENTS

| | | | |
|---|---|---|---|
| 6,403,413 B2* | 6/2002 | Hayano et al. | 438/238 |
| 6,948,533 B2* | 9/2005 | Seki et al. | 141/1 |
| 6,982,436 B2* | 1/2006 | Uchida | 257/98 |
| 7,141,817 B2* | 11/2006 | Nishi et al. | 257/40 |
| 2002/0187567 A1* | 12/2002 | Yamazaki et al. | 438/11 |
| 2003/0062519 A1* | 4/2003 | Yamazaki et al. | 257/40 |
| 2004/0071030 A1* | 4/2004 | Goda et al. | 365/222 |
| 2005/0029514 A1* | 2/2005 | Moriya | 257/40 |

FOREIGN PATENT DOCUMENTS

| | | |
|---|---|---|
| JP | 5-055528 | 3/1998 |
| JP | 5-055582 | 3/1998 |

* cited by examiner

*Primary Examiner*—W. David Coleman
*Assistant Examiner*—Sonya D McCall-Shepard
(74) *Attorney, Agent, or Firm*—Robert E. Bushnell, Esq.

(57) ABSTRACT

An OLED includes a substrate having a circuit region and a pixel region. At least one circuit Thin Film Transistor (TFT) and at least one pixel TFT are respectively arranged on the circuit region and the pixel region. Each TFT has a semiconductor layer, a gate electrode, a source electrode and a drain electrode. A pixel electrode is electrically connected to one of the source and drain electrodes of the pixel TFT. At least one silicon nitride layer is arranged between the source and drain electrodes and the substrate and is opened in the entire pixel region.

12 Claims, 9 Drawing Sheets

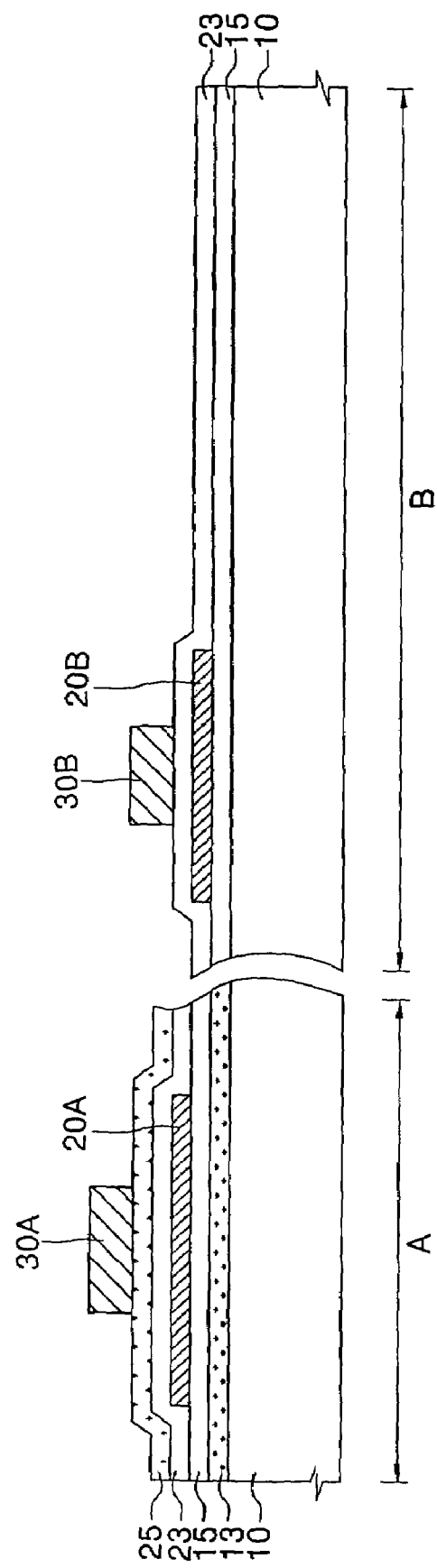

ORGANIC LIGHT-EMITTING DIODE (OLED) AND METHOD OF FABRICATION THEREOF

CLAIM OF PRIORITY

This application makes reference to, incorporates the same herein, and claims all benefits accruing under 35 U.S.C. §119 from an application entitled ORGANIC LIGHT-EMITTING DISPLAY AND METHOD OF FABRICATING THE SAME filed with the Korean Intellectual Property Office on Feb. 9, 2004, and there duly assigned Serial No. 2004-8494.

BACKGROUND OF THE INVENTION

1. Field of the Invention

The present invention relates to a display device and method of fabrication thereof and, more particularly, to an Organic Light-Emitting Display (OLED) and method of fabrication thereof.

2. Description of the Related Art

An OLED is provided with N×M sub-pixels arranged in a matrix configuration, and is classified as a passive matrix LED or an active matrix LED depending upon the manner of driving the N×M sub-pixels.

Each pixel of the active matrix OLED includes a pixel electrode and at least one Thin Film Transistor (TFT) for supplying an electrical signal to the pixel electrode. Furthermore, the active matrix OLED can include a pixel portion and a circuit portion on a single substrate. In the pixel portion, the pixel is arranged in a matrix configuration. The circuit portion has a circuit for controlling the pixel portion. The circuit portion is arranged at a periphery of the pixel portion, and the circuit for controlling the pixel portion includes TFTs. Consequently, the active matrix OLED can include respective TFTs in the pixel portion and the circuit portion, i.e., a pixel TFT and a circuit TFT.

A TFT has been discussed in Japanese Laid-Open Patent Publication No. H05-55582. The TFT discussed in the Japanese Patent includes a first blocking layer formed of silicon nitride arranged on an insulating substrate, an insulating layer formed of silicon oxide arranged on the first blocking layer, a semiconductor layer arranged on the insulating layer, a gate electrode arranged on the semiconductor layer, a second blocking layer formed of silicon nitride arranged on the gate electrode, and an interlayer insulating layer formed of PSG arranged on the second blocking layer. However, commonly applying this TFT to the circuit TFT and the pixel TFT can prevent optimization of electrical properties of the circuit TFT and the pixel TFT requiring different electrical properties.

SUMMARY OF THE INVENTION

The present invention, therefore, solves aforementioned problems associated with conventional devices by providing an OLED, in which respective electrical properties of a circuit TFT and a pixel TFT are optimized.

In an exemplary embodiment of the present invention, an OELD includes a substrate having a circuit region and a pixel region. At least one circuit TFT and at least one pixel TFT are respectively arranged on the circuit region and the pixel region. Each TFT has a semiconductor layer, a gate electrode, a source electrode and a drain electrode. A pixel electrode is electrically connected to one of the source and drain electrodes of the at least one pixel TFT. At least one silicon nitride layer arranged between the source and drain electrodes and the substrate, and opened in the entire pixel region.

The OLED can further include at least one silicon oxide layer arranged between the source and drain electrodes and the substrate.

The silicon nitride layer can comprise SiNx or SiON.

The silicon nitride layer can be a buffer nitride layer arranged between the substrate and the semiconductor layer of the at least one circuit TFT. Furthermore, the OLED can further include a buffer silicon oxide layer arranged between the substrate and the buffer nitride layer or between the buffer nitride layer and the semiconductor layer of the at least one circuit TFT, and between the substrate and the semiconductor layer of the at least one pixel TFT.

The silicon nitride layer can be a gate insulating nitride layer arranged between the semiconductor layer of the at least one circuit TFT and the gate electrode of the at least one circuit TFT. Furthermore, the OLED can further include a gate insulating silicon oxide layer arranged between the semiconductor layer of the at least one circuit TFT and the gate insulating nitride layer or between the gate insulating nitride layer and the gate electrode of the at least one circuit TFT, and between the semiconductor layer of the at least one pixel TFT and the gate electrode of the at least one pixel TFT.

The silicon nitride layer can be an interlayer insulating nitride layer arranged between the gate electrode of the at least one circuit TFT and the source/drain electrodes of the at least one circuit TFT. Furthermore, the OLED can further include an interlayer insulating silicon oxide layer arranged between the gate electrode of the at least one circuit TFT and the interlayer insulating nitride layer or between the interlayer insulating nitride layer and the layer of source and drain electrodes of the at least one circuit TFT, and between the gate electrode of the at least one pixel TFT and the layer of source and drain electrodes of the at least one pixel TFT.

Preferably, the semiconductor layer is a polysilicon layer. In addition, the pixel electrode is preferably a transparent electrode.

The OLED can further include an emission layer arranged on the pixel electrode and an opposite electrode arranged on the emission layer.

In another exemplary embodiment of the present invention, a method of fabricating an organic light-emitting display includes providing a substrate having a circuit region and a pixel region. At least one circuit TFT and at least one pixel TFT are respectively formed on the circuit region and the pixel region of the substrate. Each TFT has a semiconductor layer, a gate electrode, a source electrode and a drain electrode. A pixel electrode is formed to electrically connect to one of the source and drain electrodes of the at least one pixel TFT. Before forming the source and drain electrodes, at least one silicon nitride layer opened in the entire pixel region is formed on the substrate.

BRIEF DESCRIPTION OF THE DRAWINGS

The above and other features of the present invention will be described in reference to certain exemplary embodiments thereof with reference to the attached drawings in which:

FIGS. 1A to 1D are cross-sectional views of an OLED and method of fabrication thereof in accordance with an embodiment of the present invention;

DETAILED DESCRIPTION OF THE INVENTION

Figure 1B:
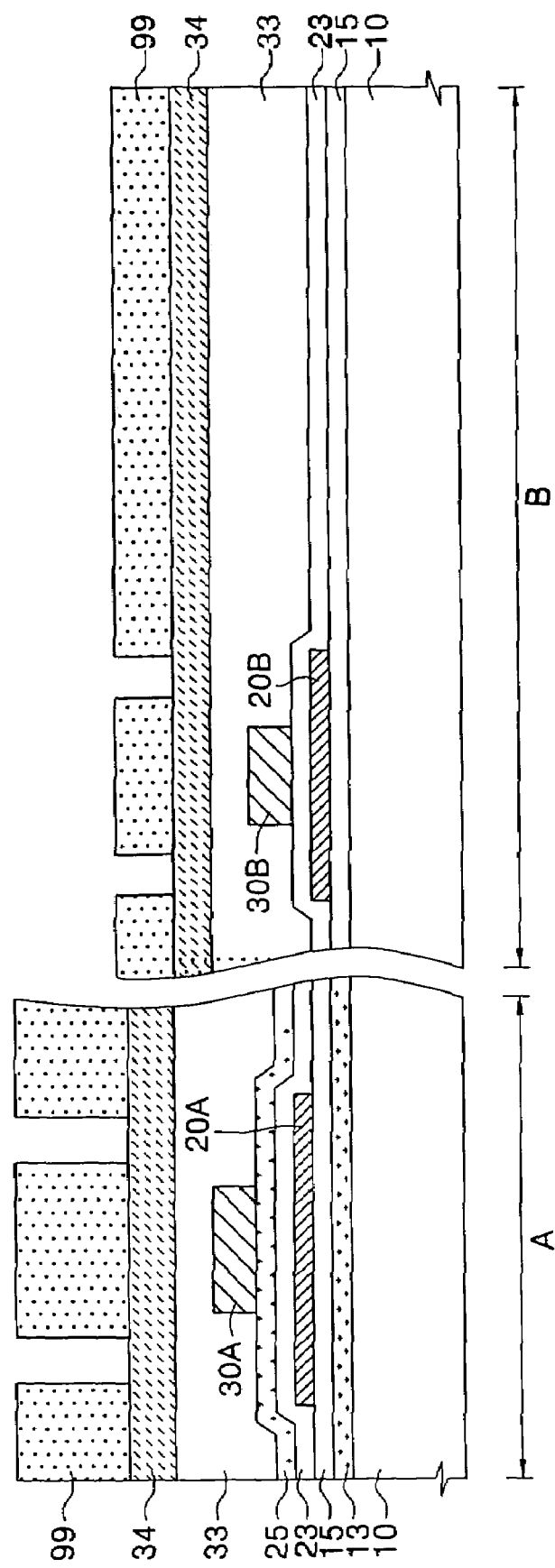

Reference will now be made in detail to the embodiments of the present invention, examples of which are illustrated in the accompanying drawings, wherein like reference numerals refer to the like elements throughout. An indication that a layer is arranged "on" the other layer or a substrate means that the layer can be directly formed on the other layer or substrate or that a third layer can be interposed therebetween.

Figure 1C:
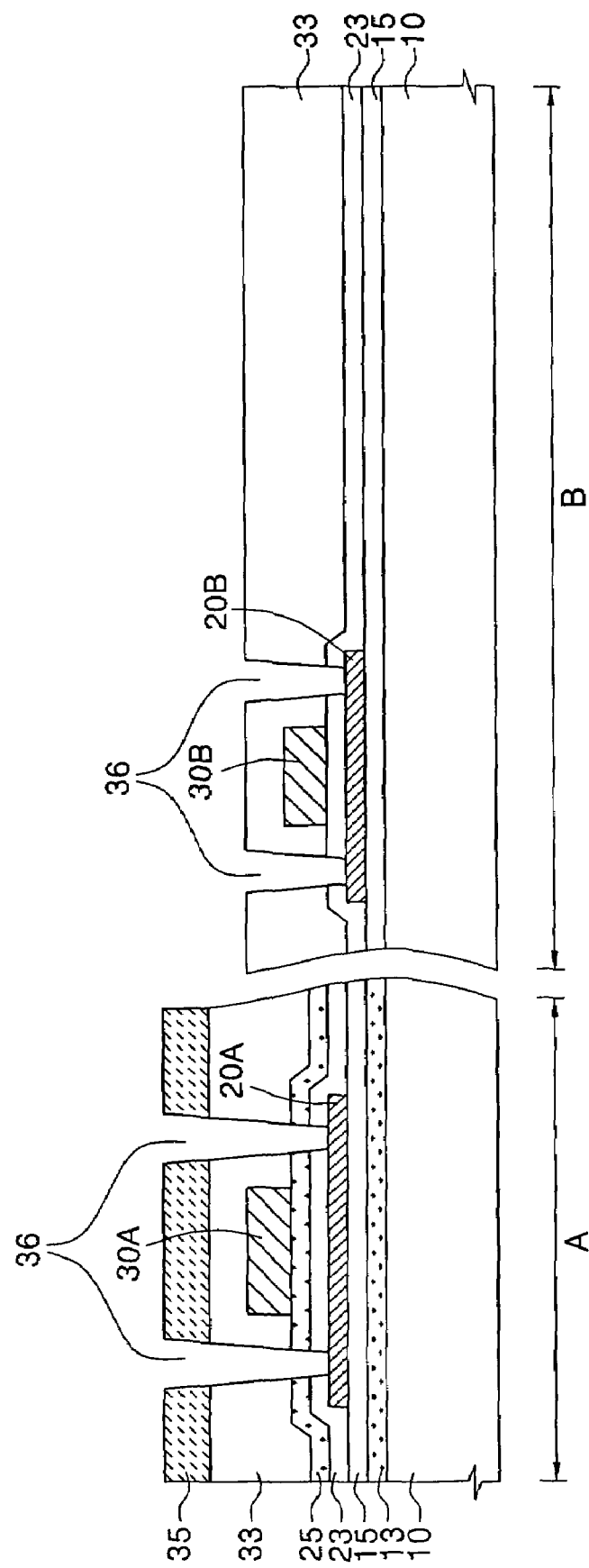
Figure 1D:
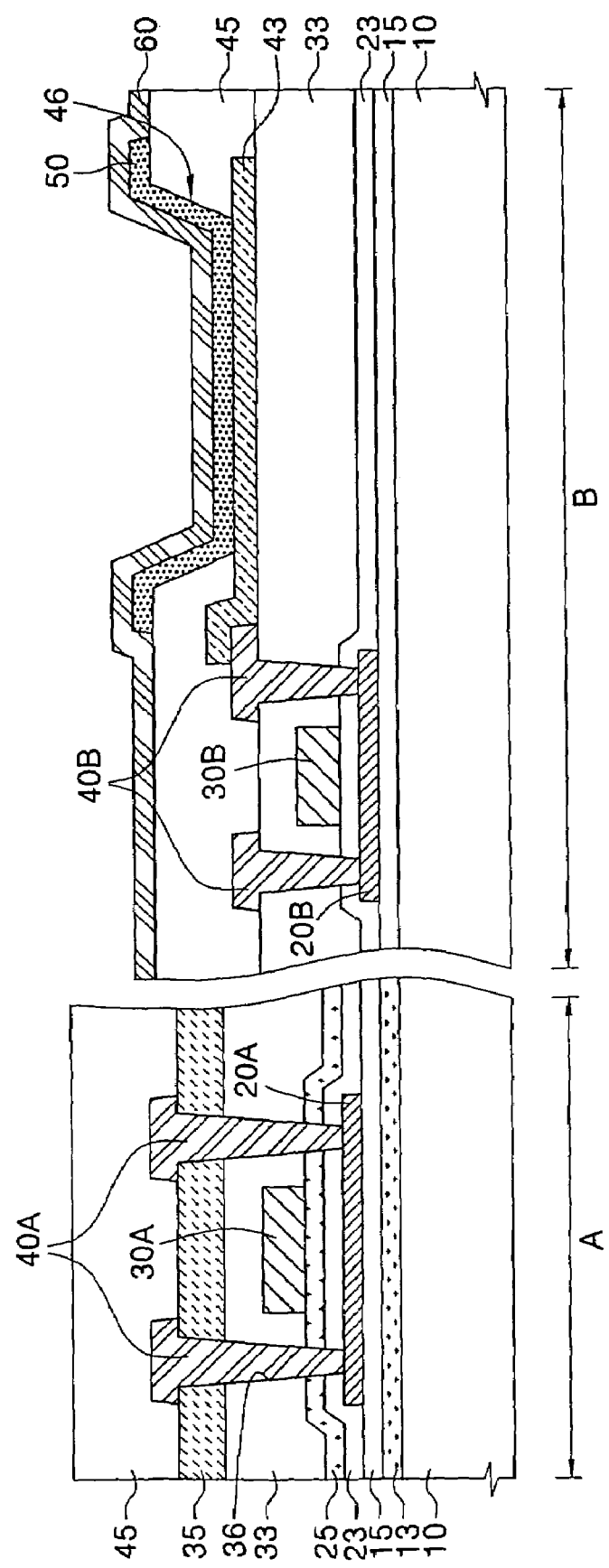

FIG. 1D is a cross-sectional view of an OLED in accordance with an embodiment of the present invention.

Referring to FIG. 1D, the OLED in accordance with an embodiment of the present invention includes a substrate 10 having a circuit region A and a pixel region B. The pixel region B is a region where pixels are arranged in a matrix configuration, and the circuit region A is a region where a circuit for electrically controlling the pixels is arranged, FIG. 1D showing only a portion of the respective regions.

At least one circuit TFT (hereinafter, referred to as a circuit TFT) is arranged on the circuit region A of the substrate. The circuit TFT is provided with a semiconductor layer 20A, a gate electrode 30A partially overlapping the semiconductor layer 20A, a source electrode 40A and a drain electrode 40A. The source and drain electrodes 40A are electrically connected to both ends of the semiconductor layer 20A. At least one pixel TFT (hereinafter, referred to as a pixel TFT) is arranged on the pixel region B of the substrate. The pixel TFT is provided with a semiconductor layer 20B, a gate electrode 30B partially overlapping the semiconductor layer 20B, a source electrode 40B and a drain electrode 40B. The source and drain electrodes 40B are electrically connected to both ends of the semiconductor layer 20B. Preferably, the semiconductor layers 20A and 20B are polysilicon layers with a carrier mobility larger than that of amorphous silicon layer.

A pixel electrode 43 is arranged to be in electrical contact with one of the source and drain electrodes 40B of the pixel TFT. Preferably, the pixel electrode 43 is a transparent electrode capable of transmitting light toward the substrate 10. The transparent pixel electrode 43 can be an anode or a cathode. The transparent pixel electrode 43 acting as an anode is preferably made of ITO (Indium Tin Oxide) or IZO (Indium Zinc Oxide), and the transparent pixel electrode 43 acting as a cathode is preferably made of Mg, Ca, Al, Ag, Ba or an alloy thereof, which preferably has a thin thickness such that light can be transmitted.

A pixel-defining layer 45 is arranged on the pixel electrode 43 and the source and drain electrodes 40A and 40B. The pixel-defining layer 45 includes an opening 46 partially exposing a surface of the pixel electrode 43, and the pixel electrode 43 exposed in the opening 46 defines a light-emitting region of the pixel. An emission layer 50 is arranged on the exposed pixel electrode 43, and an opposite electrode 60 is arranged on the emission layer 50. The emission layer 50 can be patterned by the pixel. In addition, a charge injection layer (not shown) and/or a charge transport layer (not shown) can be arranged between the emission layer 50 and the pixel electrode 43 or between the emission layer 50 and the opposite electrode 60. The opposite electrode 60 can be a transparent electrode or a reflective electrode, the opposite electrode is a cathode when the pixel electrode 43 is an anode, and the opposite electrode is an anode when the pixel electrode 43 is a cathode.

At least one layer of silicon nitride layer 13, 25 and 35 opened in the entire pixel region B is arranged between the source/drain electrodes 40A and the substrate 10. In other words, the silicon nitride layer 13, 25 and 35 are not arranged in the pixel region B, but are rather arranged in the circuit region A. The silicon nitride layer can comprise Silicon Nitride (SiNx) or Silicon OxyNitride (SiON). This silicon nitride layer contains a plentiful amount of hydrogen, the hydrogen being capable of healing defects such as a dangling bond existing in a grain boundary of a polycrystalline semiconductor layer adjacent to the silicon nitride layer. Therefore, the electrical properties of the TFT, for example, the carrier mobility and an S-factor can be modulated. More specifically, the circuit TFT of the circuit region A, at which the silicon nitride layers 13, 25 and 35 are arranged, can have a high carrier mobility and a small S-factor value. Therefore, a circuit including the circuit TFT can have a rapid data transmitting speed and the circuit TFT can effect a good switching operation. On the other hand, the pixel TFT of the pixel region B, at which the silicon nitride layers 13, 25 and 35 are not arranged, can have a low carrier mobility and a large S-factor value in comparison with the circuit TFT. The pixel TFT with the large S-factor value can readily display a gray-scale image, and the low carrier mobility does not matter due to properties of the pixel TFT. Consequently, optimized electrical properties of the pixel TFT and the circuit TFT can be implemented by forming at least one layer of the silicon nitride layer patterns 13, 25 and 35 opened in the entire pixel region B.

The silicon nitride layer has a low light transmittance. Therefore, the silicon nitride layer are not arranged in the pixel region B to prevent the light emitted from the emission layer 50 to the substrate 10 from being lost, thereby enabling the brightness of the OLED to be improved.

The silicon nitride layer can be a buffer nitride layer 13 arranged between the substrate 10 and the semiconductor layer 20A of the circuit TFT. In addition, a buffer silicon oxide layer 15 can be arranged between the substrate 10 and the buffer nitride layer 13. Preferably, as shown, the buffer silicon oxide layer 15 is arranged between the buffer nitride layer 13 and the semiconductor layer 20A of the circuit TFT. The reason for this is that the silicon oxide layer has good adhesion properties to the semiconductor layer in comparison with the silicon nitride layer. In addition, the buffer silicon oxide layer 15 is also arranged between the substrate 10 and the semiconductor layer 20B of the pixel TFT. The buffer nitride layer 13 and the buffer silicon oxide layer 15 function to prevent the semiconductor layers 20A and 20B from being deteriorated by impurities out-diffused from the substrate.

The silicon nitride layer can be a gate insulating nitride layer 25 arranged between the semiconductor layer 20A of the circuit TFT and the gate electrode 30A of the circuit TFT. Furthermore, a gate insulating silicon oxide layer 23 can be arranged between the semiconductor layer 20A of the circuit TFT and the gate insulating nitride layer 25 or between the gate insulating nitride layer 25 and the gate electrode 30A of the circuit TFT. In addition, the gate insulating silicon oxide layer 23 is also arranged between the semiconductor layer 20B of the pixel TFT and the gate electrode 30B of the pixel TFT.

Furthermore, the silicon nitride layer can be an interlayer insulating nitride layer 35 arranged between the gate electrode 30A of the circuit TFT and the layer of source/drain electrodes 40A of the circuit TFT. Still furthermore, an interlayer insulating silicon oxide layer 33 can be arranged between the gate electrode 30A of the circuit TFT and the interlayer insulating nitride layer 35 or between the interlayer insulating nitride layer 35 and the source/drain electrodes 40A of the circuit TFT. The interlayer insulating silicon oxide layer 33 is also arranged between the gate electrode 30B of the pixel TFT and the source and drain electrodes 40B of the pixel TFT. Preferably, the interlayer insulating silicon oxide layer 33 is arranged between the gate electrode 30A of the circuit TFT and the interlayer insulating nitride layer 35.

FIGS. 1A to 1D are cross-sectional views of a method of fabricating an OLED in accordance with an embodiment of the present invention.

Referring to FIG. 1A, a substrate 10 having a circuit region A and a pixel region B is provided. A silicon nitride layer is formed on the substrate 10 and patterned to from a buffer nitride layer 13 opened in the entire pixel region B. Before forming the silicon nitride layer, a buffer silicon oxide layer 15 can be formed on an entire surface of the substrate. Preferably, after forming the buffer nitride layer 13, the buffer silicon oxide layer 15 is formed on the entire surface of the substrate. The buffer silicon oxide layer 15 is arranged on the circuit region A and the pixel region B.

Semiconductor layers 20A and 20B are respectively formed on the buffer silicon oxide layer 15 of the circuit region A and the pixel region B. Preferably, the semiconductor layers 20A and 20B are polysilicon layers. Forming the polysilicon semiconductor layers 20A and 20B is performed by forming an amorphous silicon layer on the buffer silicon oxide layer 15, and crystallizing and patterning the formed amorphous silicon layer. The crystallization method includes a Solid Phase Crystallization (SPC) method, an Excimer Laser Annealing (ELA) method, a Sequential Lateral Solidification (SLS) method, a Metal Induced Crystallization (MIC) method, and a Metal Induced Lateral Crystallization (MILC) method, etc.

Another silicon nitride layer is formed on the semiconductor layers 20A and 20B and patterned, thereby forming a gate insulating nitride layer 25 opened in the entire pixel region B. Before or after forming the gate insulating nitride layer 25, a gate insulating silicon oxide layer 23 can be formed on an entire surface of the substrate. The gate insulating silicon oxide layer 23 is arranged on the circuit region A and the pixel region B.

Gate electrodes 30A and 30B partially overlapping the semiconductor layers 20A and 20B are formed on the gate insulating oxide layer 23 of the circuit region A and the pixel region B, respectively.

Referring to FIG. 1B, an interlayer insulating silicon oxide layer 33 and another silicon nitride layer 34 are sequentially formed on the gate electrodes 30A and 30B, and a photoresist pattern 99 is formed on the silicon nitride layer 34 using a halftone mask. The photoresist pattern 99 is formed such that the height of the circuit region A is higher than that of the pixel region B, and a region in which source and drain contact holes are to be formed is opened.

Referring to FIG. 1C, source and drain contact holes 36 exposing both ends of the semiconductor layers 20A and 20B are formed by etching the silicon nitride layer 34 of FIG. 1B, the interlayer insulating silicon oxide layer 33, the gate insulating nitride layer 25 and the gate insulating silicon oxide layer 23 using the photoresist pattern 99 as a mask. At the same time, the photoresist of the pixel region B having a low pattern height in comparison with the circuit region A is etched, and the silicon nitride layer 34 of FIG. 1B thereunder is also etched, thereby forming an interlayer insulating nitride layer 35 opened in the entire pixel region B.

Figure 2:
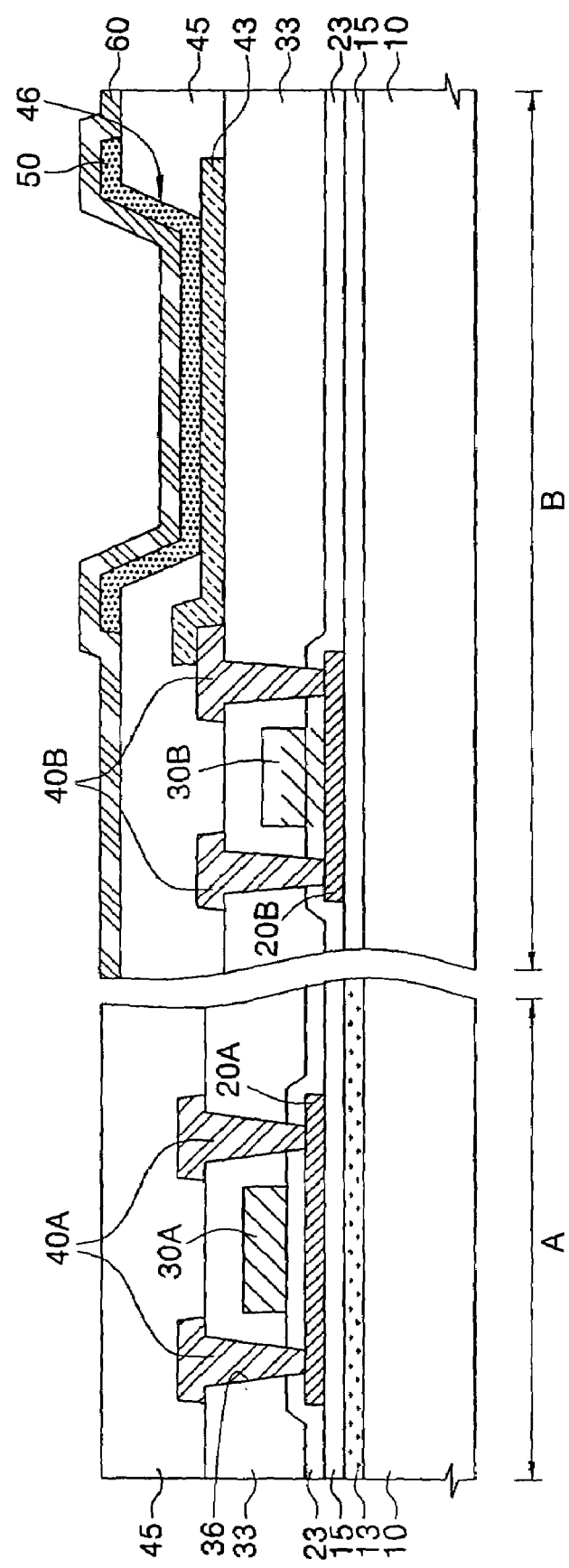
FIG. 2 is cross-sectional view of an OLED in accordance with another embodiment of the present invention.
Figure 3:
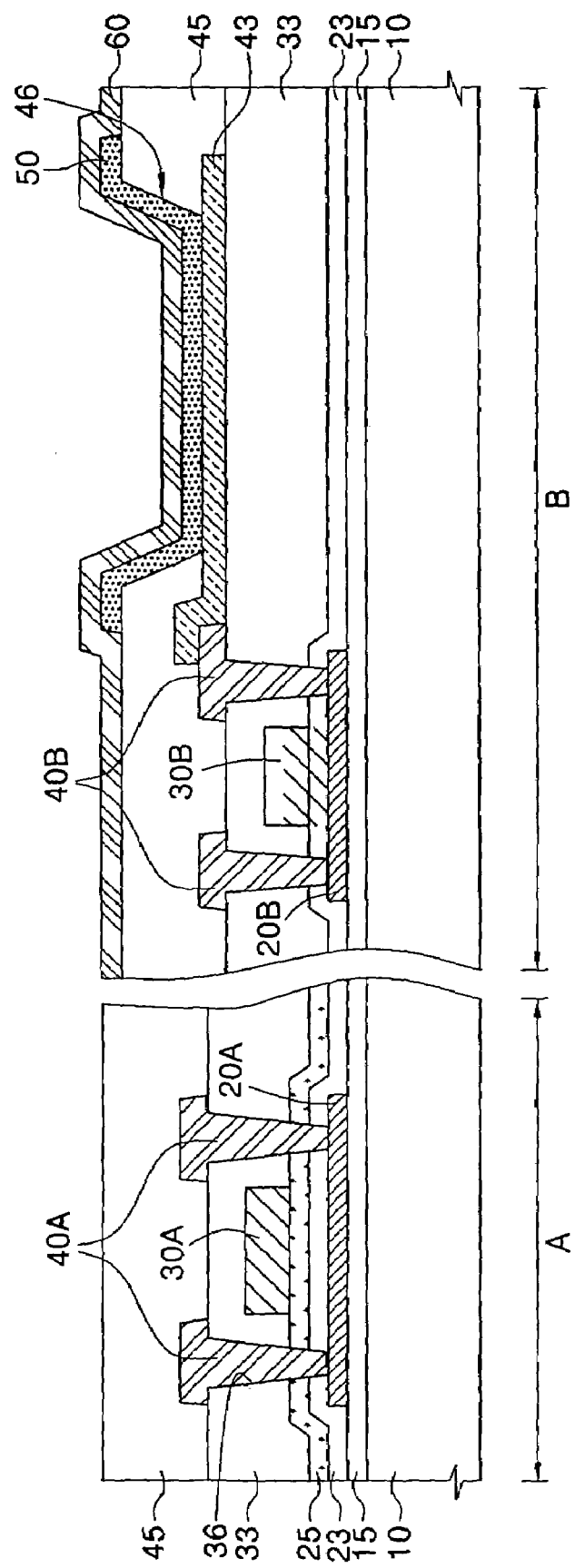
FIG. 3 is cross-sectional view of an OLED in accordance with another embodiment of the present invention.
Figure 4:
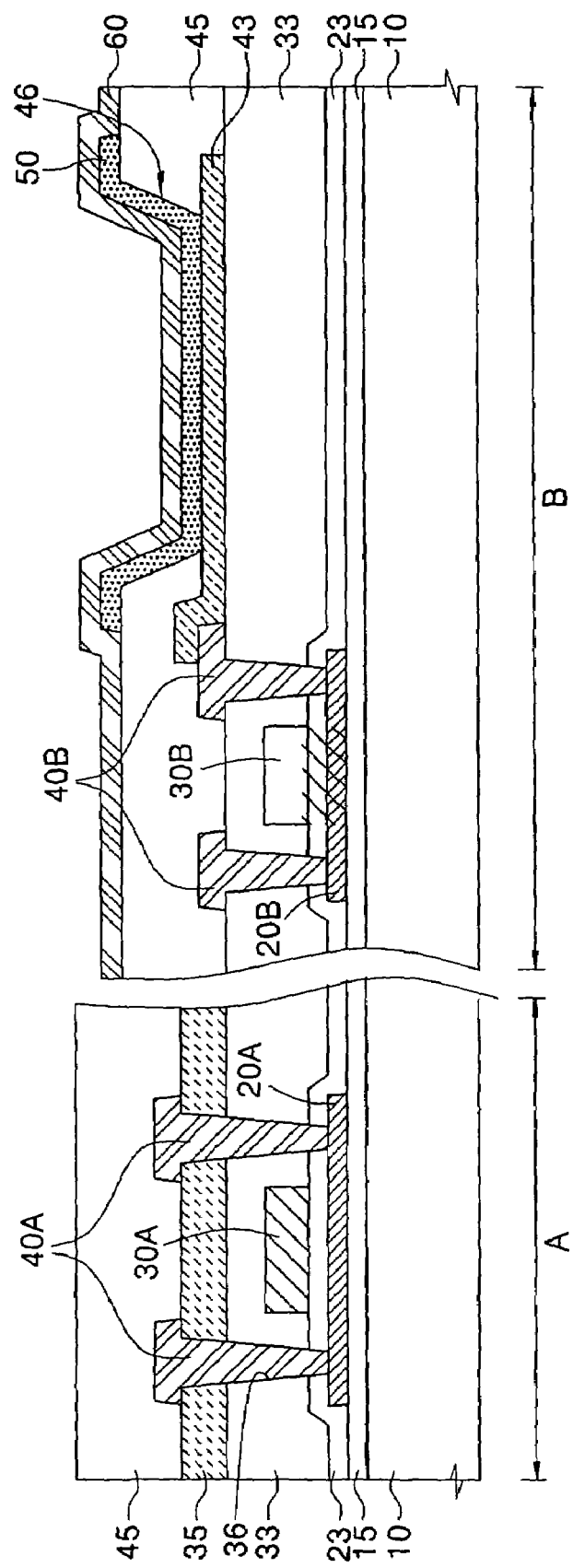
FIG. 4 is cross-sectional view of an OLED in accordance with another embodiment of the present invention.

On the other hand, the silicon nitride layer 34 of FIG. B can be deposited on the gate electrodes 30A and 30B and patterned to form the interlayer insulating nitride layer 35 opened in the entire pixel region B, and then to form the interlayer insulating silicon oxide layer 33 on the interlayer insulating nitride layer 35. At least one silicon nitride layer of the buffer nitride layer 13, the gate insulating nitride layer 25 and the interlayer insulating nitride layer 35 can be formed, and the remainder not formed. For example, only the buffer nitride layer 13 is formed as shown in FIG. 2, and only the gate insulating nitride layer 25 is formed as shown in FIG. 3 and only the interlayer insulating nitride layer 35 is formed as shown in FIG. 4.

Referring to FIG. 1D, source and drain electrode materials are deposited on the entire surface of the substrate having the source and drain contact holes 36 and patterned to respectively form source and drain electrodes 40A and 40B on the circuit region A and the pixel region B. The semiconductor layer 20A, the gate electrode 30A and the pair of source and drain electrodes 40A formed in the circuit region A constitute the circuit TFT, and the semiconductor layer 20B, the gate electrode 30B and the pair of source and drain electrodes 40B formed in the pixel region B constitute the pixel TFT.

Subsequently, a pixel electrode 43 contacting one of the source and drain electrodes 40B of the pixel TFT is formed. The pixel electrode 43 can be formed by vacuum depositing a pixel electrode material using a shadow mask. The pixel electrode 43 is preferably a transparent electrode. The transparent pixel electrode 43 can be formed of ITO or IZO. In this case, the pixel electrode 43 is an anode. On the other hand, when forming the transparent pixel electrode 43, the pixel electrode material can be Mg, Ca, Al, Ag, Ba or an alloy thereof, which is formed to be thin such that light can be transmitted. In this case, the pixel electrode is a cathode.

A pixel-defining layer 45 is formed on the pixel electrode 43 and the source and drain electrodes 40A and 40B. An opening 46 partially exposing a surface of the pixel electrode 43 is formed in the pixel-defining layer 45. The pixel electrode 43 exposed in the opening 46 defines a light-emitting region of a pixel. An emission layer 50 is formed on the exposed pixel electrode 43, and an opposite electrode 60 is formed on the emission layer 50. The emission layer 50 can be formed by patterning by the pixel. In addition, a charge injection layer (not shown) and/or a charge transport layer (not shown) can be formed between the emission layer 50 and the pixel electrode 43 or between the emission layer 50 and the opposite electrode 60. The opposite electrode 60 can be formed of a transparent electrode or a reflective electrode. The opposite electrode 60 is a cathode when the pixel electrode 43 is an anode and is an anode when the pixel electrode 43 is a cathode.

Figure 5A:
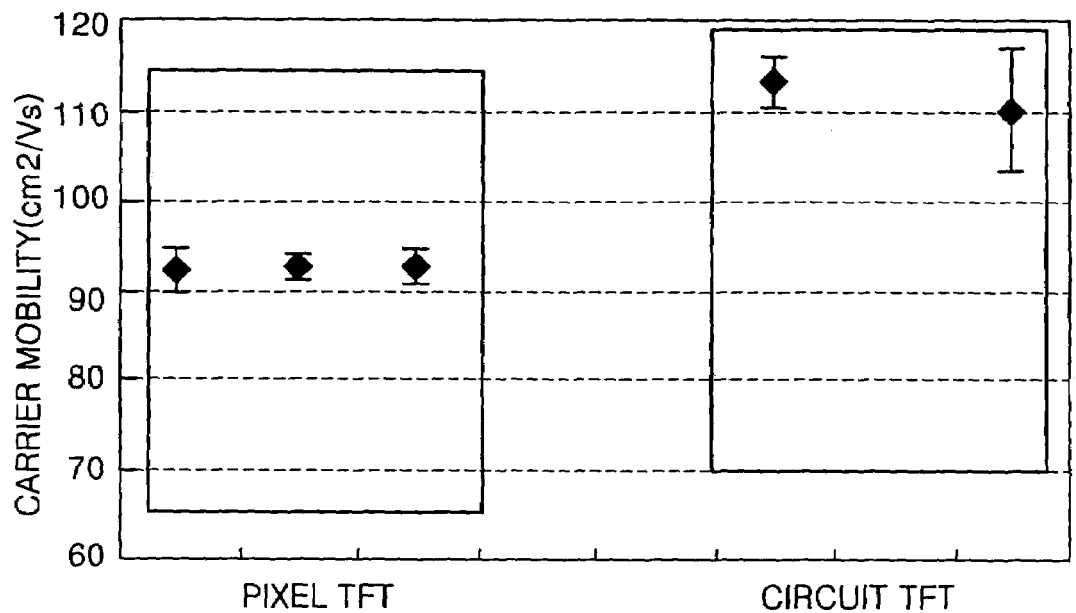
FIG. 5A is a graph of carrier mobility of a pixel TFT and a circuit TFT fabricated in accordance with an embodiment of the present invention.
Figure 5B:
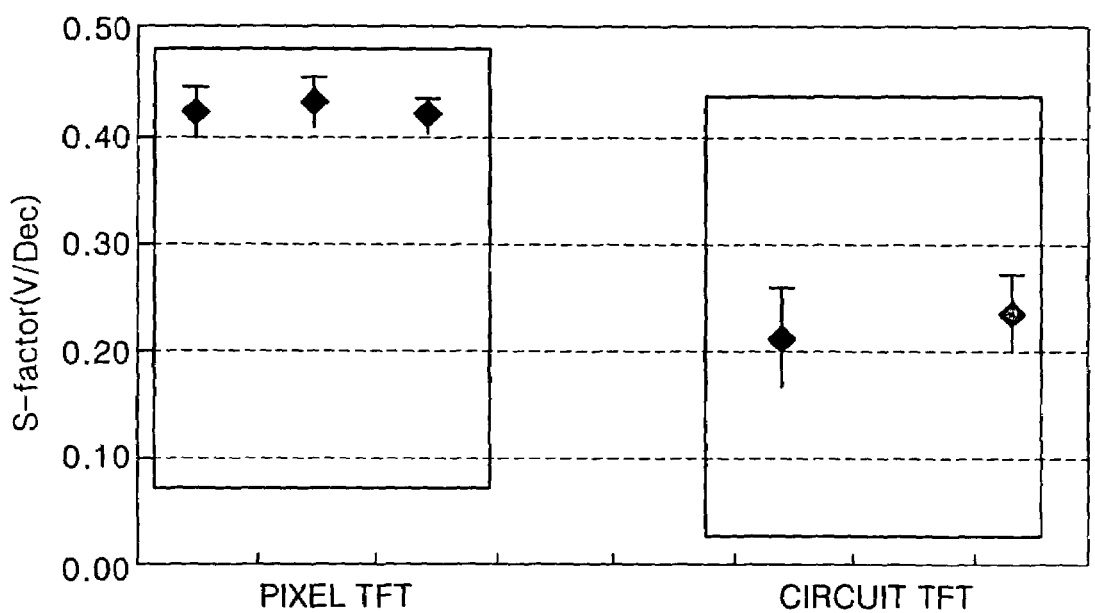
FIG. 5B is a graph of an S-factor value of a pixel TFT and a circuit TFT fabricated in accordance with an embodiment of the present invention.

FIG. 5A is a graph of carrier mobility of a pixel TFT and a circuit TFT fabricated in accordance with an embodiment of the present invention and FIG. 5B is a graph of an S-factor value of a pixel TFT and a circuit TFT fabricated in accordance with an embodiment of the present invention.

Referring to FIGS. 5A and 5B, the circuit TFT has a higher carrier mobility and a smaller S-factor value in comparison with the pixel TFT. Therefore, the circuit TFT effects a good switching operation, and a circuit including the circuit TFT has a rapid data transmission speed. On the other hand, the pixel TFT readily displays a grayscale image. Consequently, the electrical properties of the circuit TFT and the pixel TFT can be optimized.

Figure 6:
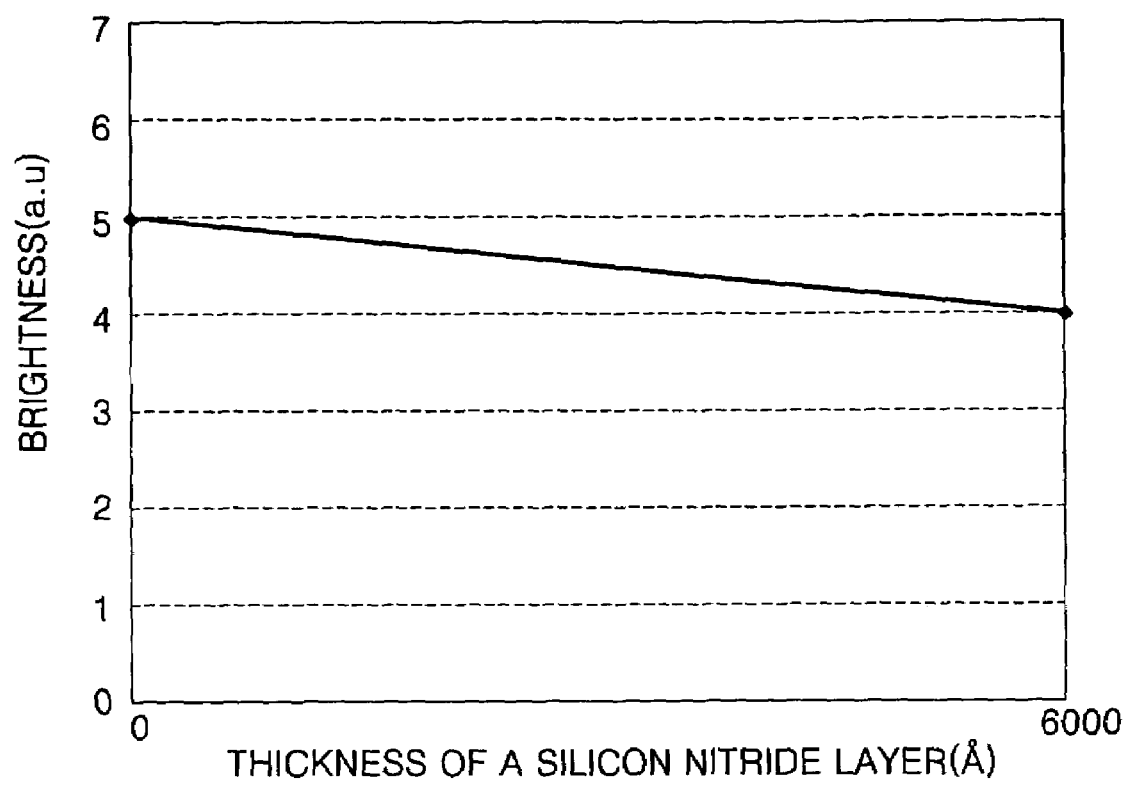
FIG. 6 is a graph of changes of brightness depending upon thickness of a silicon nitride layer.

FIG. 6 is a graph of changes of brightness depending upon thickness of a silicon nitride layer.

Referring to FIG. 6, when the thickness of the silicon nitride layer is increased, the brightness is reduced. Therefore, it is possible to prevent the brightness of the OLED from being reduced by opening the silicon nitride layer over the entire pixel region.

As can be seen from the foregoing, by forming the silicon nitride layer opened in the entire pixel region, optimized electrical properties of the pixel TFT and the circuit TFT are obtained, and the brightness of the OLED is not reduced.

Although the present invention has been described with reference to certain exemplary embodiments thereof, it will be understood by those skilled in the art that a variety of modifications and variations can be made to the present invention without departing from the spirit or scope of the present invention defined in the appended claims.

What is claimed is:

1. An Organic Light-Emitting Display (OLED) comprising:
   a substrate including a circuit region and a pixel region;
   at least one circuit Thin Film Transistor (TFT) and at least one pixel TFT respectively arranged on the circuit region and the pixel region, each TFT including a semiconductor layer, a gate electrode, a source electrode and a drain electrode;
   a pixel electrode electrically connected to one of the source and drain electrodes of the at least one pixel TFT; and
   at least one silicon nitride layer arranged only between the source and drain electrodes of the at least one circuit TFT and the substrate, and silicon nitride layers being absent from the entire pixel region;
   wherein each circuit TFT includes the source and drain electrodes directly contacting the silicon nitride layer which in turn directly contacts a silicon dioxide layer which in turn directly contacts the gate electrode; and
   wherein each pixel TFT includes the source and drain electrodes directly contacting a silicon dioxide layer which in turn directly contacts the gate electrode.

2. The OLED according to claim 1, each circuit TFT further comprising a silicon nitride layer and a silicon dioxide layer between the gate electrode and the semiconductor layer, wherein the gate electrode directly contacts the silicon nitride layer which in turn directly contacts the silicon dioxide layer which in turn directly contacts the semiconductor layer; and
   each pixel TFT further comprising a silicon dioxide layer between the gate electrode and the semiconductor layer, wherein the gate electrode directly contacts the silicon dioxide layer which in turn directly contacts the semiconductor layer.

3. The OLED according to claim 1, wherein the silicon nitride layer comprises one of silicon nitride (SiNx) and silicon oxynitride (SiON).

4. The OLED according to claim 1, each circuit TFT further comprising a silicon nitride layer and a silicon dioxide layer between the semiconductor layer and the substrate, wherein the semiconductor layer directly contacts the silicon dioxide layer which in turn directly contacts the silicon nitride layer which in turn directly contacts the substrate; and
   the each pixel TFT further comprising a silicon dioxide layer between the semiconductor layer and the substrate, wherein the semiconductor layer directly contacts the silicon dioxide layer which in turn directly contacts the substrate.

5. The OLED according to claim 1, wherein the semiconductor layer comprises a polysilicon layer.

6. The OLED according to claim 1, wherein the pixel electrode comprises a transparent electrode.

7. The OLED according to claim 1, further comprising an emission layer arranged on the pixel electrode and an opposite electrode arranged on the emission layer.

8. A method of fabricating an Organic Light-Emitting Display (OLED), the method comprising:
   providing a substrate having a circuit region and a pixel region;
   respectively forming at least one circuit Thin Film Transistor (TFT) and at least one pixel TFT on the circuit region and the pixel region of the substrate, each TFT including a semiconductor layer, a gate electrode, a source electrode and a drain electrode;
   forming a pixel electrode electrically connected to one of the source and drain electrodes of the at least one pixel TFT; and
   forming at least one silicon nitride layer on the substrate only of the circuit region and silicon nitride layer being absent from the entire pixel region before forming the source and drain electrodes;
   wherein each circuit TFT includes the source and drain electrodes directly contacting the silicon nitride layer which in turn directly contacts a silicon dioxide layer which in turn directly contacts the gate electrode; and
   wherein each pixel TFT includes the source and drain electrodes directly contacting a silicon dioxide layer which in turn directly contacts the gate electrode.

9. The method according to claim 8, further comprising forming a silicon nitride layer and a silicon dioxide layer between the gate electrode and the semiconductor layer in the circuit region, wherein the gate electrode directly contacts the silicon nitride layer which in turn directly contacts the silicon dioxide layer which in turn directly contacts the semiconductor layer; and
   forming a silicon dioxide layer between the gate electrode and the semiconductor layer in the pixel region, wherein the gate electrode directly contacts the silicon dioxide layer which in turn directly contacts the semiconductor layer.

10. The method according to claim 8, wherein the silicon nitride layer comprises one of SiNx and SiON.

11. The method according to claim 8,
    further comprising forming a silicon nitride layer and a silicon dioxide layer between the semiconductor layer and the substrate in the circuit region, wherein the semiconductor layer directly contacts the silicon dioxide layer which in turn directly contacts the silicon nitride layer which in turn directly contacts the substrate; and
    forming a silicon dioxide layer between the semiconductor layer and the substrate in the pixel region, wherein the semiconductor layer directly contacts the silicon dioxide layer which in turn directly contacts the substrate.

12. The method according to claim 8,
    wherein the silicon nitride layer is simultaneously formed with forming source and drain contact holes in the silicon nitride layer and the silicon dioxide layer with a halftone mask.

* * * * *